United States Patent
He et al.

(10) Patent No.: US 6,998,868 B2
(45) Date of Patent: Feb. 14, 2006

(54) TEST KEY FOR BRIDGE AND CONTINUITY TESTING

(75) Inventors: Jun He, Shanghai (CN); Dong Li, Shanghai (CN); DeXue Leng, Shanghai (CN); Mon Chin Tsai, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 10/967,172

(22) Filed: Oct. 19, 2004

(65) Prior Publication Data

US 2005/0083078 A1    Apr. 21, 2005

(30) Foreign Application Priority Data

Oct. 21, 2003  (CN)  .................... 200310108059 A

(51) Int. Cl.
*G01R 31/26*  (2006.01)

(52) U.S. Cl. ..................................... 324/765

(58) Field of Classification Search ............ None
See application file for complete search history.

(56) References Cited

U.S. PATENT DOCUMENTS 6,268,717 B1 *   7/2001  Jarvis et al. ............. 324/158.1
6,621,289 B1 *   9/2003  Voogel ...................... 324/765

* cited by examiner

*Primary Examiner*—Minh Nhut Tang
*Assistant Examiner*—Trung Q. Nguyen
(74) *Attorney, Agent, or Firm*—Rosenberg, Klein & Lee

(57) ABSTRACT

A test key for bridging and continuity testing is provided, comprising at least one test unit, which is composed of a first strand and a second strand embedded or non-touching intertwined with each other. The strand comprising a closed hook, a corresponding extension and a corresponding connection. The corresponding connections are electrically connected to an external voltage by at least one test pad, wherein the closed hook of the first strand is parallel with the closed hook of the second strand. A first corner is formed between the closed hooks and the corresponding extension, causing the closed hook of the first strands to be adjacent and parallel with the closed hook and the extension of the second strand. Moreover, another corner is formed between the extension and the corresponding connection, causing the connection of the first strand to be adjacent and parallel with the extension of second strand, forming an intertwining pattern.

15 Claims, 2 Drawing Sheets

US 6,998,868 B2

TEST KEY FOR BRIDGE AND CONTINUITY TESTING

FIELD OF THE INVENTION

The present invention relates to a test key, and more specifically, to a test key for SRAM bridge and continuity testing.

DESCRIPTION OF THE PRIOR ART

In SRAM design, it is common for metal interconnects to have hook-shaped corners and ends. Unfortunately, this makes it easy for short circuits to occur in these critical areas. These hook-shaped corners and ends are very sensitive to photo conditions in SRAM cell processing. If the separate metals are not developed and etched enough during the photo and etching procedures, short circuits will occur resulting in fatal SRAM failure.

Additionally, test keys used for traditional parallel-lines design aren't usable with circuits having multi-hook-shaped corners and ends. Moreover, the cost of testing increases because various testing keys are required.

Therefore, the present invention provides an improved test key for bridge and continuity testing that allows one key to be used for both tests.

SUMMARY OF THE INVENTION

The present invention provides a test key for SRAM bridging and continuity testing.

The present invention also provides a test key which is similar to the real metal layout of SRAM, having multi-hook-shaped corners and ends.

In accordance with the present invention, a test key for bridge and continuity testing is provided, comprising at least one test unit, which is composed of a first strand and a second strand entwined without touching each other. The strands comprise a closed hook, a corresponding extension and a corresponding connection. The corresponding connections are electrically connected to an external voltage by at least one test pad, wherein the closed hook of the first strand is parallel with the closed hook of the second strand. A first corner is formed between the closed hooks and the corresponding extension, causing the closed hook of the first strand to be adjacent and parallel with the closed hook and the extension of second strand. Moreover, another corner is formed between the extension and the corresponding connection, causing the connection of the first strand to be adjacent and parallel with the extension of second strand, forming a closely non-touching intertwined pattern.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

These and other objects, features and advantages of the present invention can best be understood by reference to the detailed description of the preferred embodiments set forth below taken with the drawings, in which.

DESCRIPTION OF THE PREFERRED EMBODIMENTS

Figure 1:
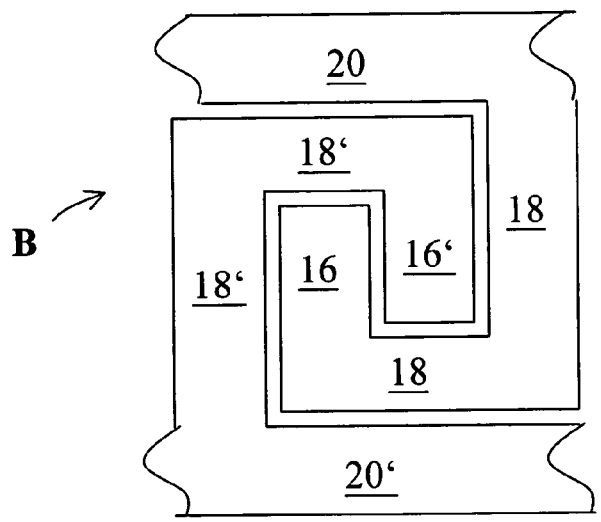
FIG. 1 is a drawing illustrating a test key in accordance with an embodiment of the present invention.

Refer to FIG. 1, which is a drawing illustrating a test key in accordance with an embodiment of the present invention. A test key, comprising at least one test unit, is provided. The first test unit "B" comprises two strands intertwined but not in contact with each other. Each of the strands comprises one closed hook 16 (or 16'), one corresponding extension 18 (or 18'), and one corresponding connection 20 (or 20'). Either of the connections 20 (or 20') is electrically connected to an external voltage by at least one test pad (not shown). The closed hook 16 of one strand is parallel with the closed hook 16' of the other strand. At least one corner is formed between the closed hooks 16 (or 16') and the extension 18 (or 18'), causing the closed hook 16 of one strand adjacent and parallel to the closed hook 16' and the extension 18' of the other strand. Another corner is formed between the extension 18 (or 18') and the corresponding connection 20 (or 20'), causing the connection 20 of one strand to be adjacent and parallel to the corresponding extension 18', so as to form a non-touching intertwined pattern. Moreover, the connection 20 (or 20') is connected with other test units.

Figure 2:
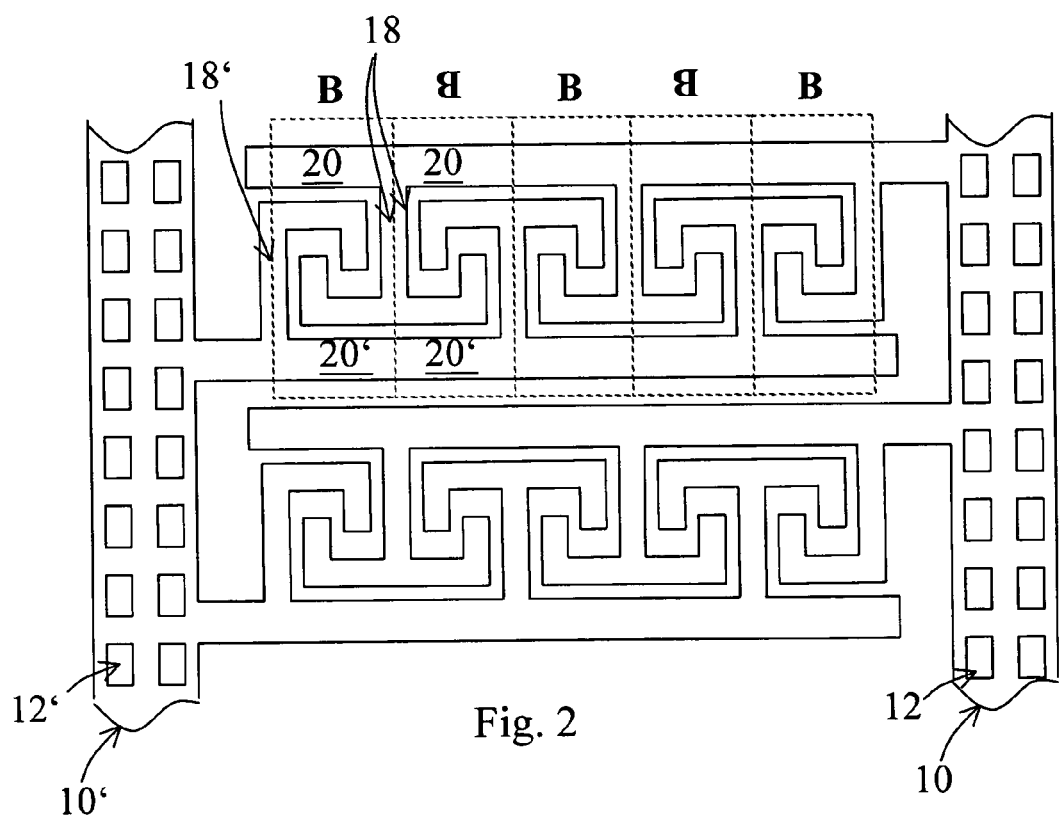
FIG. 2 is a drawing illustrating a test key comprising a plurality of test units in accordance with an embodiment of the present invention.

Refer to FIG. 2, which is a drawing illustrating a test key comprising a plurality of test units according to an embodiment of the present invention. The test key shown in FIG. 2 can be applied in SRAM bridge testing. Based on the first test unit of FIG. 1, a second test unit "inverted-B" is used in conjunction with the first test unit "B" of FIG. 1, forming the required test pattern or layout. One end of the connection 20' of one strand of first test unit "B" is connected with another end of the connection 20' of one strand of second test unit "inverted-B". Another end of the connection 20' of one strand of first test unit "B" is connected with a test pad area 10' comprising at least one test pad 12'.

In addition, the extension 18 of one strand of first test unit "B" is adjacent and parallel with the extension 18 of another strand of second test unit "inverted-B". The connection 20 of one strand of first test unit "B" is connected with the connection 20 of another strand of second test unit "inverted-B".

As shown in FIG. 2, the layout of the portion of the test key comprising test pad 12' and test pad area 10' is a the same as the layout of the portion of the test key comprising test pad 10 and test pad area 10. The two are just flipped and rotated 180 degrees.

In use, this structure can be used for both bridging and continuity testing. For bridge testing, voltage is applied to test pads 12 and 12'.

An advantage of the test key of the present invention is that, the test key comprises test units which are similar with the practical metal layout of SRAM, having multi-hook-shaped corners and ends. It is helpful for testing corners and ends, and also for monitoring the yield of corners and ends in lithography and etch processing.

Figure 3:
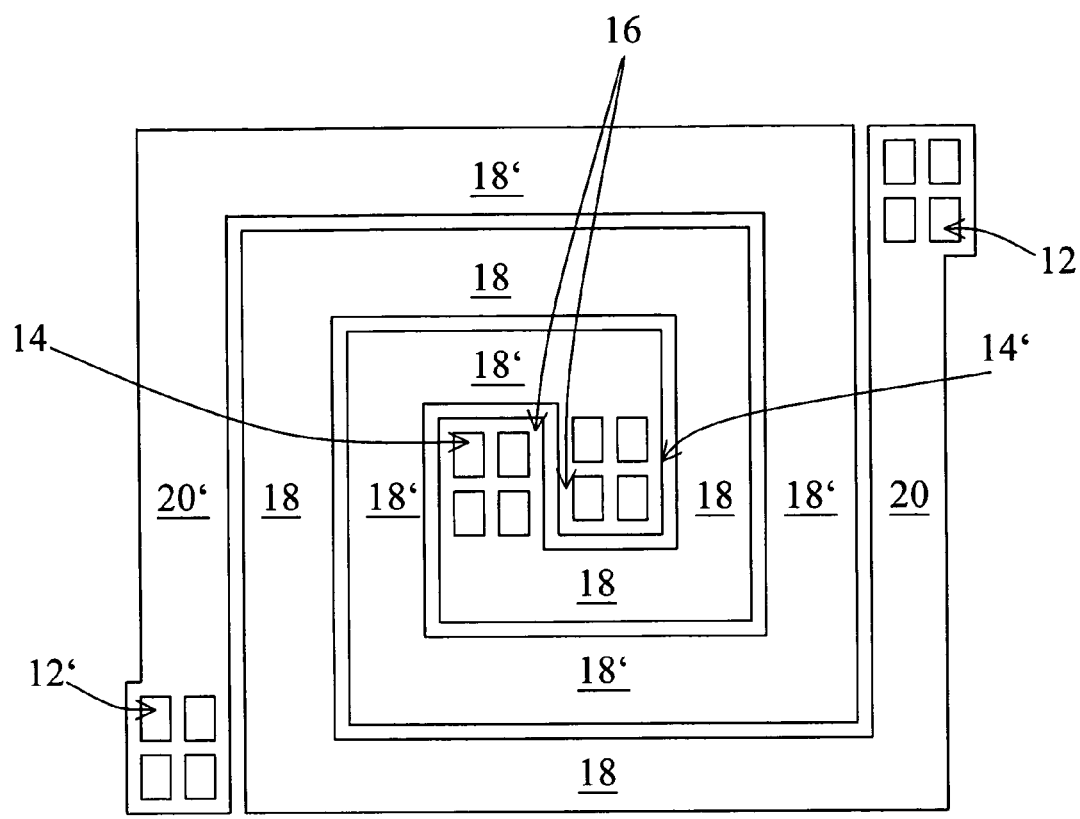
FIG. 3 is a drawing illustrating a test key applied in SRAM bridging and continuity testing in accordance with an embodiment of the present invention.

Refer to FIG. 3, which is a drawing illustrating a test key applied in bridging and continuity testing according to an embodiment of the present invention. The closed hooks 16

(or 16') comprise a corresponding test pad 14 (or 14'). Moreover, the test pad 12' and 12 are positioned on the connection 20 (20') of each strand. It should be noted that, the closed hook 16 (or 16') or the connection 20 (or 20') can be adjusted in width, size, and length depending on the test pads or circuit requirements.

In addition, the extensions 18 (or 18') comprise at least one corresponding corner on the corresponding extension 18 (or 18'), causing one portion of the extension 18 of one strand to be adjacent and parallel to one portion of the extension 18' of another strand. When performing the continuity test, an external voltage is applied on the test pad 12 and 14, or test pad 12' and 14'. Selectively, when performing the bridging test, an external voltage is applied on the test pad 12 and 14', or the test pad 12' and 14. An advantage of the test key of the present invention is that, using one test key, the bridging and continuity can be performed, without using separate or different test keys, so as to reduce the cost of testing.

In accordance with the present invention, a test key for SRAM bridging and continuity testing is described, comprising at least two test units. Each test unit comprises a first strand and a second strand non-touchingly intertwined or embedded with each other. The strands comprise at least one closed hook, one corresponding extension, and one corresponding connection. Any of connections is electrically connected to an external voltage by at least one test pad. The closed hook of a first strand is parallel with the closed hook of a second strand. A first corner is formed between the closed hooks and extension, causing the closed hook of a first strand to be adjacent and parallel to the closed hook of a second strand and the extension of second strand. A second corner is formed between the extension and the connection, causing the connection of the first strand to be adjacent and parallel to the extension of the second strand, forming the test key in an non-touching but intertwining or embedded pattern.

While the invention has been particularly shown and described with reference to the preferred embodiments thereof, it will be understood by those skilled in the art that various changes in form and details may be made without departing from the spirit and scope of the invention.

What is claimed is:

1. A test key for SRAM bridging and continuity testing, comprising at lease one test unit, which is composed of a first strand and a second strand embedded with each other, characterized in that:

the first strand and the second strand have a closed hook, a corresponding extension, and a corresponding connection, the corresponding connections electrically connecting with an external voltage by at least one first test pad, wherein the closed hook of the first strand is parallel with the closed hook of second strand, and at least one first corner is formed between any of the closed hooks and the corresponding extension, so that the closed hook of the first strand is adjacent and parallel with the closed hook and the corresponding extension of the second strand, and a second corner is formed between the corresponding extension and the corresponding connection, so that the corresponding connection of the first strand is adjacent and parallel to the corresponding extension of the second extension, so as to form an embedded pattern.

2. The test key of claim 1, further comprising at least two test units for bridging test, a first test unit and a second test unit, characterized in that:

an end of the corresponding connection of the first strand of the first test unit connecting with the corresponding connection of the first strand of the second test unit, and another end of the corresponding connection of the first strand of the first test unit connecting with the corresponding extension with the first test pad;

the corresponding extension of the second strand of the first test unit being adjacent and parallel with the corresponding extension of the second strand of the second test unit;

the corresponding connection of the second strand of the first test unit connecting with the corresponding connection of the second strand of the second test unit; and the corresponding connection of the second strand of the first test unit connecting with a second test pad to other voltages, and a bridging test is performed when applying two external voltages on the first test pad and the second test pad.

3. The test key of claim 1, wherein any of the corresponding extensions further comprises at least one third corner thereon, causing one portion of the corresponding extension of the first strand to be adjacent and parallel with one portion of the corresponding extension of the second strand.

4. The test key of claim 3, wherein any of the closed hooks comprises at least one second corresponding test unit.

5. The test key of claim 4, wherein a continuity test is performed when applying the voltage on the second test pad corresponding to the closed hook of the first strand, and the first test pad corresponding to the connection of the first strand.

6. The test key of claim 4, wherein a continuity test is performed when applying the voltage on the second test pad corresponding to the closed hook of the second strand, and the first test pad corresponding to the connection of the second strand.

7. The structure of the test key of claim 4, wherein a bridging test is performed when applying the voltage on the second test pad corresponding to the closed hook of the first strand, and the first test pad corresponding to the connection of the second strand.

8. The test key of claim 4, wherein a bridging test is performed when applying the voltage on the second test pad corresponding to the closed hook of the second strand, and the first test pad corresponding to the connection of the first strand.

9. A test key for SRAM bridging and continuity test, comprising at lease one test unit, which is composed of a first strand and a second strand non-touchingly intertwined with each other, characterized in that:

the first strand and the second strand having a closed hook, a corresponding extension, and a corresponding connection, the corresponding connections comprising at least one first test pad electrically connecting to an external voltage, and the closed hooks comprising at least one second corresponding test pad electrically connecting to another voltage, wherein the closed hook of the first strand is paralled with the closed hook of the second strand, and at least one first corner is formed between the closed hooks and the extensions, causing the connection of the first strand to be adjacent and parallel with the closed hook and the corresponding extension of the second strand, and a second corner is formed between the corresponding extension and the corresponding connection, causing the corresponding connection of the first strand to be adjacent and paralleled to the corresponding extension of the second extension, so as to form an intertwining pattern.

10. The test key of claim 9, wherein the corresponding extension further comprises at least one third corner thereon, causing one portion of the extension of the first strand to be adjacent and parallel with one portion of the extension of the second strand.

11. The test key of claim 9, wherein a continuity test is performed when applying the voltage on the second test pad corresponding to the closed hook of the first strand, and the first test pad corresponding to the connection of the first strand.

12. The test key of claim 9, wherein a continuity test is performed when applying the voltage on the second test pad corresponding to the closed hook of the second strand, and the first test pad corresponding to the connection of the second strand.

13. The test key of claim 9, wherein a bridging test is performed when applying the voltage on the second test pad corresponding to the closed hook of the first strand, and the first test pad corresponding to the connection of the second strand.

14. The test key of claim 9, wherein a bridging test is performed when applying the voltage on the second test pad corresponding to the closed hook of the second strand, and the first test pad corresponding to the connection of the first strand.

15. A test key for SRAM bridging and continuity test, comprising at lease two test units, each test unit comprising a first strand and a second strand intertwined with each other, characterized in that:

the first strand and the second strand having a closed hook, a corresponding extension, and a corresponding connection, the corresponding connections comprising at least one first test pad electrically connecting to a external voltage, wherein the closed hook of the strand is parallel with the closed hook of the strand, and at least one first corner is formed between the closed hooks and the extensions, causing the closed hook of the first strand to be adjacent and parallel with the closed hook and the corresponding extension of second strand, and a second corner is formed between the corresponding extension and the corresponding connection, causing the corresponding connection of the first strand to be adjacent and parallel to the corresponding extension of the second extension, so as to form an intertwining pattern;

one end of the connection of the first strand of the first test unit connecting with the connection of the strand of the second test unit, and another end of the connection of the first strand of the first test unit is connected the corresponding connection with the first test pad;

the extension of the second strand of the first test unit being adjacent and parallel to the extension of the second strand of the second test unit;

the connection of the strand of the first test unit connecting with the connection of the second of the test unit; and the connection of the second strand of the second test unit connecting a second test pad to other voltages, performing a bridging test when applying two external voltages on the first test pad and the second test pad.

* * * * *